United States Patent [19]

Katayama et al.

[11] Patent Number: 5,343,076
[45] Date of Patent: Aug. 30, 1994

[54] SEMICONDUCTOR DEVICE WITH AN AIRTIGHT SPACE FORMED INTERNALLY WITHIN A HOLLOW PACKAGE

[75] Inventors: Shigeru Katayama; Kaoru Tominaga; Junichi Yoshitake, all of Sodegaura, Japan

[73] Assignee: Mitsui Petrochemical Industries, Ltd., Tokyo, Japan

[21] Appl. No.: 155,539

[22] Filed: Nov. 22, 1993

Related U.S. Application Data

[63] Continuation of Ser. No. 731,979, Jul. 18, 1991, abandoned.

[30] Foreign Application Priority Data

| | | | |
|---|---|---|---|
| Jul. 21, 1990 | [JP] | Japan | 2-193617 |
| Feb. 21, 1991 | [JP] | Japan | 3-027106 |
| Jun. 13, 1991 | [JP] | Japan | 3-142056 |

[51] Int. Cl.$^5$ ............ H01L 23/48; H01L 23/02; H01L 23/12; H01L 29/40
[52] U.S. Cl. .............. 257/717; 257/700; 257/704; 257/710; 257/711; 257/690; 257/741
[58] Field of Search ............ 357/69, 70, 72; 257/690, 700, 704, 710, 711, 717, 741

[56] References Cited

U.S. PATENT DOCUMENTS

| | | | |
|---|---|---|---|
| 4,875,087 | 10/1989 | Miyauchi et al. | 357/71 |
| 4,961,106 | 10/1990 | Butt et al. | 357/74 |
| 4,965,659 | 10/1990 | Sasame et al. | 357/81 |
| 4,975,761 | 12/1990 | Chu | 357/72 |
| 4,994,895 | 2/1991 | Matsuzaki et al. | 357/72 |
| 5,034,800 | 7/1991 | Marchisi | 357/72 |
| 5,049,977 | 9/1991 | Sako | 357/72 |
| 5,063,434 | 11/1991 | Emoto | 357/72 |
| 5,089,879 | 2/1992 | Komenaka | 357/72 |

FOREIGN PATENT DOCUMENTS

| | | |
|---|---|---|
| 58-069174 | 4/1983 | Japan . |
| 58-148440 | 9/1983 | Japan . |
| 63-44745 | 2/1988 | Japan . |
| 63-054756 | 3/1988 | Japan . |
| 63-116462 | 5/1988 | Japan . |
| 63-152159 | 6/1988 | Japan . |
| 01011356 | 1/1989 | Japan . |
| 2058358 | 2/1990 | Japan . |
| 2105542 | 4/1990 | Japan . |
| 2105545 | 4/1990 | Japan . |

*Primary Examiner*—Sara W. Crane
*Assistant Examiner*—Valencia M. Wallace

[57] ABSTRACT

This invention relates to a package construction of a semiconductor device, and provides a semiconductor device in which a vapor-impermeable moistureproof plate is embedded in a bottom surface of a hollow package or an inner surface wallthicknesswise therefrom to provide an excellent moisture-proofness in terms of the package construction.

5 Claims, 3 Drawing Sheets

LENGTH FROM BONDING SURFACE TO UPPER SURFACE OF ISLAND PORTION (t) [mm]

SEMICONDUCTOR DEVICE WITH AN AIRTIGHT SPACE FORMED INTERNALLY WITHIN A HOLLOW PACKAGE

This application is a continuation of application Ser. No. 07/731,979 filed on Jul. 18, 1991, now abandoned.

BACKGROUND OF THE INVENTION

The present invention relates to a semiconductor device and method for manufacturing the same, and more specifically, to a semiconductor device in which moisture-proofness of an airtightly sealed semiconductor package is improved and a method for manufacturing the same.

In a semiconductor chip such as an IC, LSI or VLSI, a highly-integrated circuit surface tends to be affected by the change in ambient temperature of humidity, or fine dust. Further, since a semiconductor chip itself tends to be broken by mechanical vibrations or shocks, it is used as a semiconductor device together with a package for covering the semiconductor chip.

The package type is roughly divided into an airtight seal type and a resin mold type. In the former, the airtight seal type, an airtight space is formed in the central portion of a package member, and a semiconductor chip is arranged within the airtight space. As a material for such a hollow package, ceramics having a high moisture-proofness are generally used, but synthetic resins which have low cost and are easy to work with are also used.

In a semiconductor device using such a hollow package made of synthetic resin, a semiconductor chip is secured to a bonding surface (a chip bonding surface) of a hollow portion by means of adhesives and is electrically connected to a lead frame by means of a bonding wire. Opposite ends of the lead frame are opened to an inner side and an outer side of the package.

The top surface of the hollow package is airtightly sealed by securing a cover member or lid such as a transparent or opaque synthetic resin plate, a glass plate or the like thereto by adhesives.

In the case where such a hollow package made of synthetic resin is used, there arises a problem in that even if the cover member is secured by means of adhesives, a fine amount of moisture enters into the package as time passes. As a result, electrodes of the semiconductor chip or internal circuit becomes corroded to lower the function thereof, and finally result in an unusable condition.

Even if careful seal means is applied to an adhesive portion of the cover or a seal portion of the lead frame which are contemplated to be an entry route of moisture, it is still not possible to prevent entry of moisture after passage of time, a countemeasure of which has been worked out.

The present inventors have repeatedly made studies to clear up the cause of entry of a fine amount of moisture into an airtightly sealed semiconductor package. At the outset, it has been assumed that a route of entry of moisture into the semiconductor package is from the adhesive portion of the cover member or the seal portion of the lead frame.

Therefore, tests were repeatedly carried out to clear up the cause from that field.

However, it has been found that the entry of moisture from the adhesive portion of the cover member or the seal portion of the lead frame possess is not much of a problem since various countermeasures are taken. However, the entry of moisture into the semiconductor package principally results from the moisture which transmits through a molded body from the lowermost surface of the package, that is, the bottom surface of the hollow package.

It is to be noted that the entry of moisture into the semiconductor package was tested in the following manner.

A package sealed by a transparent cover member is put into a commercially available pressure cooker tester (PCT) and heated and pressurized under the conditions of temperature (121° C.), humidity (100% RH) and gauge pressure (1 kg/cm$^2$) for a predetermined number of hours, after which it was removed to examine if condensation was formed caused by moisture entered internally of a transparent cover member under normal temperature.

Those which have no condensation are continued to be heated and pressurized for the predetermined number of hours until condensation appears.

Accordingly, in the present invention, the quality of the moisture-proofness of the package was determined by the length of heating and pressurizing time until condensation appears in the inside of the transparent cover member.

It is an object of the present invention to provide a semiconductor device of an airtight seal type having an excellent moisture-proofness which can effectively prevent an entry of moisture.

SUMMARY OF THE INVENTION

The present invention has a feature in which a vapor-impermeable moistureproof plate is provided on the bottom surface of a hollow package or on an inner portion wall-thicknesswise therefrom.

According to a first embodiment of the moistureproof plate, an island portion connected to a lead frame through a support lead is formed on the bottom surface of the hollow package or on an inner portion wall-thicknesswise therefrom.

This support lead has an important meaning for fixing the island portion to an accurate position, but even if the support lead is present in a state cut interiorly after molding, the effect of preventing the moisture-proofness of the semiconductor device is not lowered.

Accordingly, in molding, the island portion as well as the lead frame itself are set beforehand within a mold to effect insert molding whereby an integrally molded hollow package can be manufactured.

This island portion is preferable in that it is connected to the lead frame through the support lead so that a semiconductor package with the island portion fixed at an accurate position at the time of molding can be molded.

Furthermore, according to the present invention, there is provided a semiconductor device in which said island portion is provided internally (lower) of the bonding surface and internally (upper) of the bottom surface of the hollow package, particularly closer to the bottom surface of the hollow package by at least 100 μm or more from the bonding surface, whereby the prevention or impediment of entry of moisture into the hollow package is further effectively achieved.

Moreover, according to the present invention, after a lead frame having an island portion has been set beforehand to a predetermined position within a mold, synthetic resin is subjected to injection molding or transfer molding, whereby the island portion, the lead portion, and the hollow package can be integrated.

According to a second embodiment of the vapor-impermeable moistureproof plate, a moistureproof plate formed from a vapor-impermeable plate-like member is embedded on the bottom surface of an airtight sealed hollow package or on an inner portion wall-thickness-wise therefrom.

In this embodiment, since the moistureproof plate is an element separately from the lead frame, there is the advantage that the material, size, etc. of the moistureproof plate can be suitably selected irrespective of a material or size of the lead frame.

BRIEF DESCRIPTION OF THE DRAWINGS

FIG. 1 is a side sectional view showing one example of a hollow package according to the present invention integrated by insert molding, FIG. 2 is a side sectional view showing one example in which an airtight sealed semiconductor device is completed, FIG. 3 is a side sectional view showing a further example in which an airtight sealed semiconductor device is completed;

FIG. 6 is a side sectional view showing one example of a hollow package of the present invention integrated by insert molding, and FIG. 7 is a side sectional view showing one example in which an airtight sealed semiconductor device is completed.

DETAILED DESCRIPTION OF THE INVENTION

Figure 1:
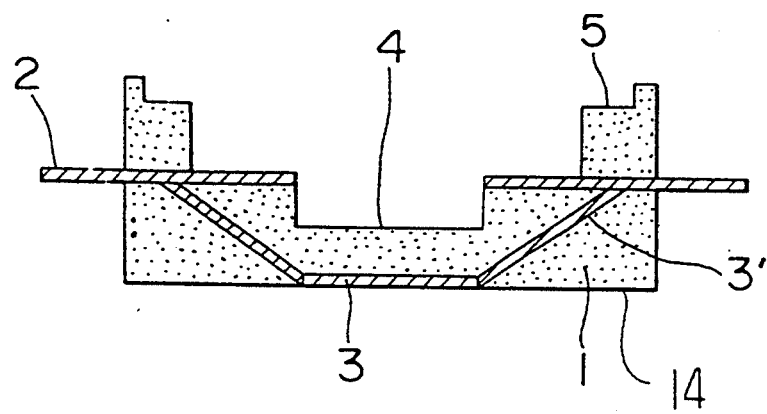
FIGS. 1 to 3 show a first embodiment of the present invention.

A semiconductor device according to this invention, which comprises a semiconductor chip with a hollow package, a lid(cover member) and a moisture proof plate, therefrom to provide an excellent moisture-proofness of an airtight sealed semiconductor package construction.

A hollow package 1 aforementioned is made of synthetic resin, and which is preferably molded of thermosetting resins such as epoxy resin, polyimide resin (for example polyaminomaleimide, polypyromeritimide), phenol resin, unsaturated polyester resin, silicon resin, etc., or heat resistant thermoplastic resins such as liquid-crystal polymer, polyphenylsulfide resin, polysulfone resin, etc.

Among the synthetic resins aforementioned, epoxy resin such as bisphenol-A type, orthocresol novolak type, glycidyl amine type, etc., is preferred in view of mouldability and moisture-proofness, and a hollow package of this invention can provide through injection or transfer moulding.

The moistureproof plate 11, can be a vapor impermeable plate-like member, particularly, where a material such as metal such as iron, copper, nickel, aluminum, alloys and their oxide, ceramic, glass, etc. is utilized. In the case where out of these material, metal such as aluminum, copper and iron, alloys or their oxide which has a heat transfer rate in excess of 0.01 cal/cm. sec. °C. are used, not only the moisture-proofness is improved but also the effect in which heat generation phenomenon of the semiconductor chip 7 is radiated outside the package is obtained, and the operating stability of the semiconductor element can be also retained.

In case moisture proof plate consists of a part of the lead frame, the lead frame is desirably formed of a material selected out of copper, iron, aluminum or a group comprising an alloy thereof, or preferably 42 alloy or a copper alloy.

The lead frame 2 is wholly or partly as necessary applied with a surface treatment, for example, applied with plating such as gold, silver, nickel, solder, etc. For example, nickel plating containing no lustering agent can be used. More specifically, saccharin or the like can be added to smooth the plated surface.

Embodiment 1

In FIG. 1 showing in a side sectional view one example of a package for semiconductor device in which an island portion 3 is formed internally of a bottom surface, the reference numeral 1 designates a hollow package made of synthetic resin; and 2, a lead frame.

The island portion 3 is connected to the lead frame 2 through a support lead 3' and secured to a position lower than the other lead portion.

The reference numeral 4 designates a bonding surface on which a semiconductor chip 7 is secured by means of adhesives, and numeral 5 designates a cover adhesive portion for sealing a space in the package.

The hollow package 1 is molded of aforesaid synthetic resins such as epoxy resin, polyimide resin.

The lead frame 2 (including the island portion 3) is formed of a material from the group of copper, iron, aluminum, or an alloy thereof, and preferably 42 alloy or a copper alloy.

Other plate-like material such as a copper plate can be joined to the island portion 3 for improving heat radiation properties. In this manner, the plate-like member such as the copper plate is joined to the island portion 3 whereby not only the moisture-proofness of the semiconductor device is improved but also the effect of efficiently radiating heat generated in the semiconductor chip 7 outside the package is attained to retain the stability of operation of the semiconductor chip 7.

The plate-like member may have the same size as that of the island portion 3, or an area larger than the former.

Figure 4:
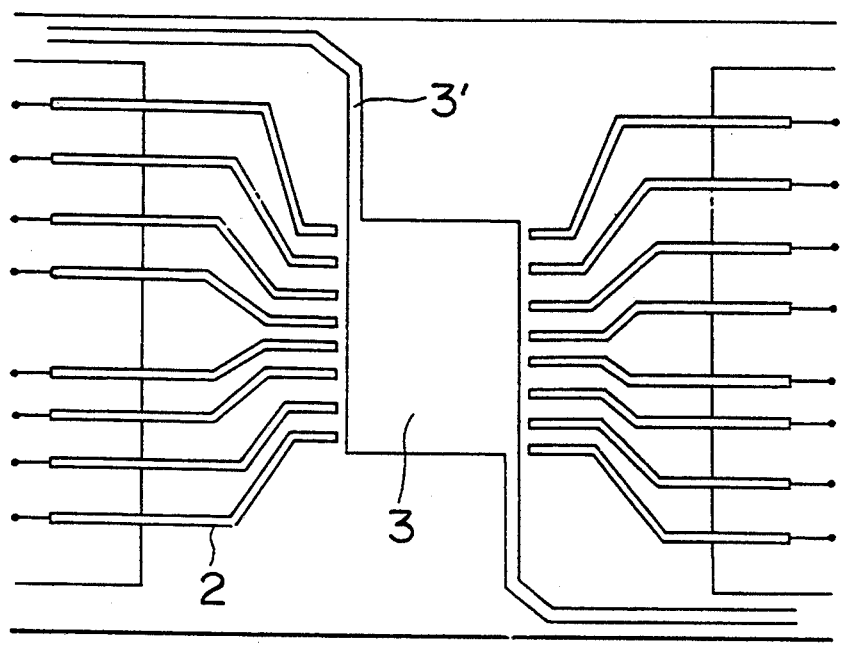
FIG. 4 is a top view showing one example of shapes of a lead frame and an island before insert molding in the first embodiment.

In the present embodiment, the island portion 3 is connected to the lead frame 2 through the support lead 3' as shown in FIG. 4.

The island portion 3 is integrally formed on the same plane as the lead frame 2 at the time of fabrication as a part of the lead frame 2, but thereafter only said portion is depressed by a suitable amount by post-working.

Accordingly, the island portion 3 and the lead frame 2 are formed of the same material. However, in order to improve the anticorrosion and radiation properties, only the island portion 3 may be partly plated or other material such as a copper plate may be joined as mentioned above.

As described above, preferably, the island portion 3 is formed inwardly (in the figure, below the bonding surface 4) from the bonding surface 4 and inwardly (in the figure, above the bottom surface 14 of the package) from the bottom surface 14 of the hollow package 1, particularly, closer to the bottom surface 14 by at least 100 μm or more from the bonding surface.

The registration of the upper surface of the island portion 3 with the bonding surface is not preferable since the moisture-proofness is lowered.

The forming position of the island portion 3 is suitably adjusted by operation when the lead frame 2 is pressed, for example.

The thickness of the island portion 3 is normally 50 to 1000 μm, preferably, 100 to 500 μm, and has its size which is substantially the same as that of the bottom surface of the semiconductor chip 7. The larger size thereof brings forth preferable results according thereto.

The lid adhesive portion 5 is preferably provided with a shoulder as shown in order to obtain better sealing effect.

The semiconductor chip 7 is secured to the bonding surface 4 of the hollow package 1, the chip and the lead frame 2 are connected by a bonding wire 6, and thereafter the cover member 8 or lid is adherred to the cover adhesive portion 5 of the package 1 by adhesives such as epoxy group, imide group or acrylic group to provide an airtight seal.

As the bonding wire 6, gold or aluminum wire is normally used. As the cover member 8 or lid, there can be used transparent cover member 8 such as a glass plate, a sapphire plate, a transparent alumina plate, a transparent plastic plate, etc. or translucent or opaque cover members 8 such as a colored glass plate, a ceramics plate, a colored plastic plate, etc.

Figure 2:
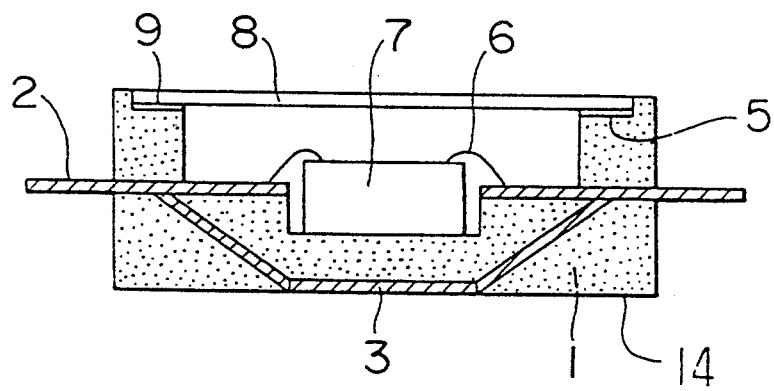
Figure 3:
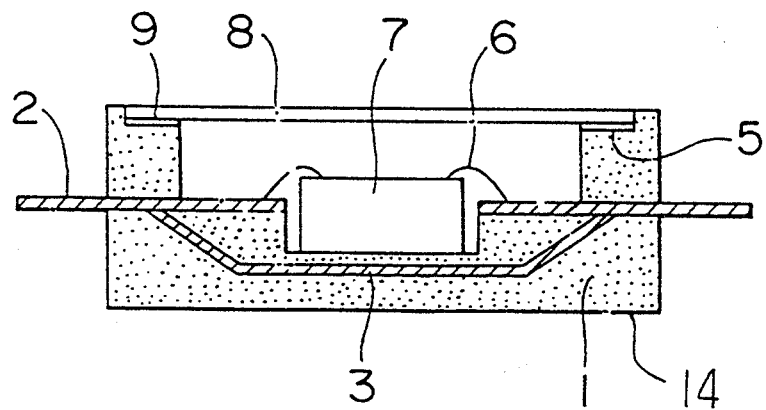

While FIG. 2 shows an example in which the lower surface of the island portion 3 is at a position of the bottom surface of the hollow package, it is to be noted that the island portion 3 may be arranged further inwardly of the bottom surface of the hollow package.

A semiconductor device according to this embodiment is manufactured in the following procedure.

The lead frame 2 having the island portion 3 depressed by a predetermined distance from other portions is set beforehand to a predetermined position within the mold, and subsequently, epoxy resin such as bisphenol A type, orthocresol novolak type, glycidyl amine type. etc., are integrated by injection or transfer molding.

According to this method, a position of the island portion 3 of the lead frame 2 sealed into the hollow package 1 is depressed by suitable pressing means, for example, press machine so that it can be determined in advance to an accurate position. Therefore, a single step of inserting at the time of molding will suffice, and the trouble of cumbersome positioning can be omitted.

The conditions of insert molding differ when using different kinds of resins. In an example of using epoxy resin, preferably, pressing and heating are carried out under the general conditions of 10 to 800 kg/cm² of pressure, 150° to 200° C. of temperature, 1 to 5 minutes of time, and post-curing is added as needed. The lead frame 2 having the depressed island portion 3 is subjected to insert molding whereby the island portion 3 with excellent moisture-proofness is secured with high precision to the bottom surface of the hollow package 1 or to an inner portion therefrom. The operating steps can be simplified, and in addition, positive fixing can be attained.

The present inventors have conducted the following experiments in order to measure the moisture-proofness of the semiconductor package according to the present embodiment.

It is to be noted that the entry of moisture into the semiconductor package was tested by the following method (Method A for evaluation).

A package sealed by a transparent cover member 8 was put into a commercially available pressure cooker tester and heated and pressurized for two hours under the conditions of temperature (121° C.), humidity (100% RH) and gauge pressure (1 kg/cm²), after which it was removed. The package on the side of the transparent cover member was pressed against the hot plate and heated for 15 seconds at 80° C. and thereafter the transparent cover member was pressed against a brass block for 10 seconds at 25° C. to examine if condensation caused by entered moisture is formed internally of the transparent cover member. Those which have no condensation are less entered moisture, which was judged to produce no practical problem. Accordingly, in the present invention, the quality of the moisture-proofness of the package is determined by the length of heating in the pressure cooker tester time until the condensation appears internally of the transparent cover material.

Experiment 1

A lead frame 2 (thickness: 250 μm) made of 42 alloy subjected to nickel plating with a lustering agent (saccharin) combined having an island portion 3 as shown in FIG. 4 was pressmolded. Only the island portion 3 was depressed and set to a predetermined position within the mold of a transfer molding machine.

Next, molding material of an orthocresol novolak type epoxy resin and phenol novolak curing agent was transferred into the mold under the conditions that temperature is 180° C., pressure is 120 kg/cm² and time is 3 minutes, after which it was subjected to post-curing for three hours at 180° C. to obtain a molded article (thickness of bottom is 1 mm) as shown in FIG. 1.

Subsequently, the cover adhesive portion 5 was coated with the epoxy resin to form an adhesive layer 9, to which a cover member 8 made from a transparent glass plate was adherred to airtightly seal a hollow package 1.

This hollow package 1 was applied to a pressure cooker tester under the above-mentioned conditions.

The package was removed every two hours to examine if condensation appears on the inside of the glass cover member 8.

As a result, no condensation was recognized at 12 hours but condensation was recognized first after 14 hours. The result obtained by measuring the difference of moisture-proofness varying the forming position from the package die pad surface (bonding surface 4) to the upper surface of the island portion 3 was as indicated by the dotted line (marked by Δ) in FIG. 5. The thickness of the package used (from the bottom surface of the semiconductor chip 7 (bonding surface) to the bottom surface of the package) was 1 mm. Time until a blur occurs inside was measured by the same method.

On the other hand, in a package fabricated in the exactly same manner except that an incorporation of the island portion is not embodied, a condensation was recognized in four hours by a similar pressure cooker test.

Experiment 2

An experiment was conducted in a manner similar to that of the aforesaid Experiment 1 except that nickel-plated 42 alloy with a lustering agent not combined was used as the lead frame 2.

Figure 5:
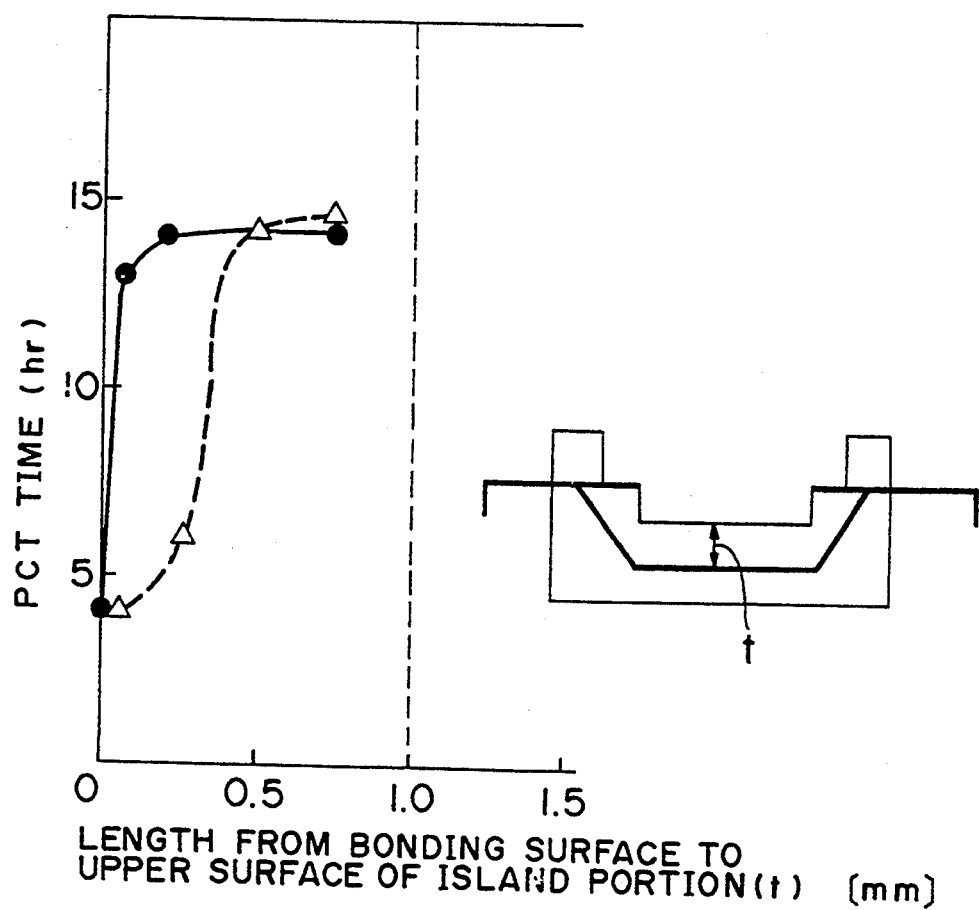
FIG. 5 is a graph showing the result of a pressure cooker test according to differences in position in which an island is formed in the first embodiment.

The result obtained by measuring the difference of moisture-proofness suitably varying a forming position (t) from the bonding surface 4 to the upper surface of the island portion was shown by the solid line (marked by ●) in FIG. 5.

It has been found from the aforesaid result that the position in which the island portion 3 is formed is preferably provided at an inner portion from the bonding surface 4, and internally of the bottom surface of the hollow package 1, particularly, closer to the bottom surface by at least 100 μm or more from the bonding surface.

Experiment 3

An experiment was conducted in a manner similar to that of the aforesaid experiment 1 except that 42 alloy not applied with plating was used as the lead frame.

As the result, the same evaluation as the mark ● in FIG. 5 was obtained.

Embodiment 2

Figure 6:
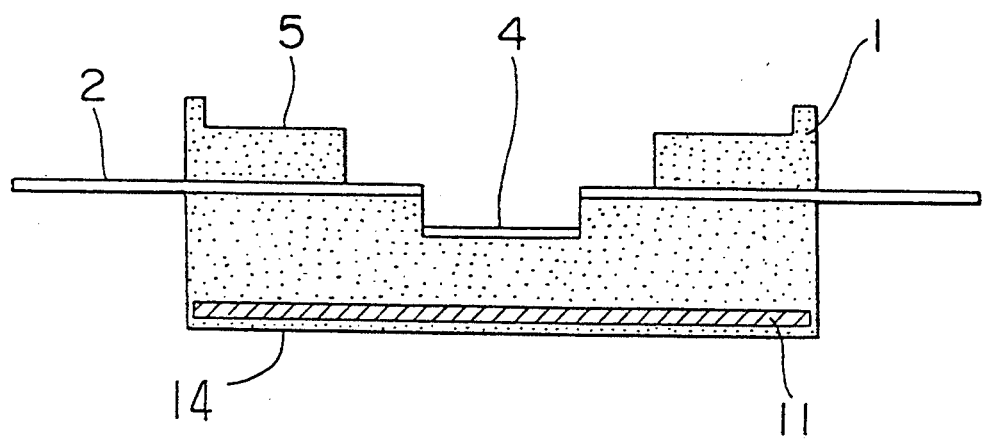
FIGS. 6 and 7 show a second embodiment of the present invention.

In this embodiment, a moisture-proof plate 11 separately from a lead frame 2 is embedded from the bottom surface of a hollow package 1 inwardly wall-thicknesswise, as shown in FIG. 6.

In FIG. 6, the reference numeral 1 designates a hollow package formed of thermosetting resins such as epoxy resin, polyimide resin: 2, a lead frame formed of 42 alloy, copper alloy. etc.; 4, a bonding surface for securing a semiconductor chip: and 5, a cover adhesive portion for sealing a semiconductor device, the cover adhesive portion being provided with a shoulder for providing better sealing effect similarly to the aforementioned Embodiment 1.

The reference numeral 11 designates a moisture proof plate which comprises the technical feature of the present embodiment, and which is selected aforementioned materials.

Alloys or their oxide which has a heat transfer rate in excess of 0.01 cal/cm. sec. °C. are used, not only the moisture-proofness is improved but also the effect in which heat generation phenomenon of the semiconductor chip 7 is radiated outside the package is obtained, and the operating stability of the semiconductor element can be also retained.

The thickness of the moistureproof plate 11 is normally 50 to 1000 μm, preferably, 100 to 500 μm.

The size of the moistureproof plate 11 is selected between the bottom surface of the semiconductor chip 7 and the bottom surface of the hollow package is preferably, as shown in FIG. 6 substantially the same as the bottom surface (lowermost surface) of the hollow package 1.

Preferably, the moistureproof plate 11 is embedded on the bottom surface 14 of the hollow package 1 or inwardly thereof as shown in FIG. 6. In the case where the function as a radiation plate is added to the moistureproof plate 11, the moistureproof plate 11 may be provided to be closer to the semiconductor chip 7 ( for example, by adjusting the length of a lead member 10 ).

Figure 7:
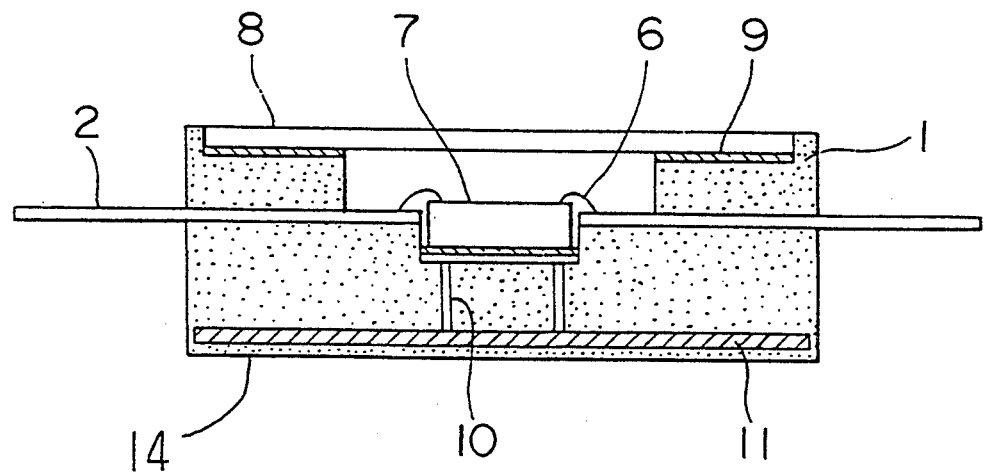

Furthermore, as shown in FIG. 7, a lead member 10 which is hung directly below the bonding surface 4 and connected to the moistureproof plate 11 may be provided. Naturally, in this case, the lead member 10 is preferably formed of a material having a heat transfer rate in excess of 0.01 cal/cm sec. °C. With the provision of the lead member 10, heat generated from the semiconductor chip 7 is transmitted to the moistureproof plate 11 to enhance the radiation effect.

A lead frame 2 made of 42 alloy an a moistureproof plate 11 made of copper alloy having a thickness of 250 μm and a heat transfer rate of 0.53 cal/cm. sec. °C. were inserted to a predetermined position within a mold of a transfer molding machine. Next, a novolak type epoxy resin as molding material together with curing agent was insert-molded under the conditions wherein temperature is 180° C., pressure is 80 kg/cm$^2$ and time is 2 seconds, after which it was subjected to post-curing for 3 hours at a temperature of 180° C. to obtain a hollow package 1 as shown in FIG. 6.

Then, a cover member 8 made from a transparent glass plate was adherred to a cover adhesive portion 5 of the hollow package 1 by an epoxy resin (adhesive layer 9).

The aforementioned insert molding conditions differ with the kind of resin used. However, in case of the epoxy resin, pressing and heating under the conditions wherein in generally pressure is 10 to 500 kg/cm$^2$, temperature is 150° to 200° C. and time is 1 to 5 minutes are preferable.

The moistureproof plate 11 is subjected to insert molding simultaneously with the lead frame 2 whereby the moistureproof plate 11 is fixed with high precision on the bottom surface of the hollow package 1 or inwardly therefrom. Not only operating step is simplified but also accurate fixing is attained as compared with the method for adhering the moistureproof plate 11.

The airtight sealed package was evaluated under the following conditions (Method B for evaluation). Specifically, this package was applied to a pressure cooker tester under the conditions wherein temperature is 121° C., humidity is 100% RH and gauge pressure is 1 kg/cm$^2$. It was removed every 5 hours and was left under room temperatures for an hour to examine if condensation is recognized internally of the glass cover under room temperature.

Incidentally, this package was not forcibly cooled under this Method B for evaluation. However, under aforesaid Method A for evaluation, that package was forcibly cooled in that stage.

As the result, condensation was not recognized at 45 hours but recognized first after 50 hours. On the other hand, in a package fabricated in a manner similar to the former except that an incorporation of a moisture-proof plate is not embodied, condensation was recognized in 20 hours by a similar pressure cooker test, and the effect of the moistureproof plate was conspicuous.

As described above, according the present embodiment, by formation of a layer of a vapor-impermeable moistureproof plate 11 on the bottom surface of the hollow package 11 or inwardly therefrom, an entry of moisture from the bottom surface of the package in which a moisture permeability into the semiconductor package is highest is efficiently prevented. Furthermore, by insert molding of the moistureproof plate 11 along with the lead frame 2, the moisture proof plate 11 can be fixed to the inner surface or outer surface of the hollow package 1 with high precision and by a simple step.

A semiconductor chip 7 according to the invention is used a solid image pickup element such as Charge Coupled Device, Metal Oxide Semiconductor or Charge Priming Device. It is sealed by aforesaid hollow package and a lid (cover member 8) which is made from a transparent glass.

When a solid image pickup device is produced with the members, the device has features of airtightness, vaportightness and high reliability.

What is claimed is:

1. A semiconductor device comprising:
    a hollow package including an airtight space formed in a central portion of said hollow package;
    a semiconductor chip; and
    a vapor-impermeable moistureproof plate including an island portion connected to a lead frame by a support lead, said island portion provided in an area greater than or equal to a bottom surface of said semiconductor chip at a position lower than a surface of the lead frame and at a position lower than a bottom surface of said semiconductor chip;
    wherein said island portion is provided close to the bottom portion of said hollow package and at least 100 μm from a bonding surface for securing said semiconductor chip to the support lead;
    wherein said semiconductor chip is bonded on an inner surface of a bottom portion of said hollow package, and said vapor-impermeable moistureproof plate is placed between an outer surface and an inner surface of the bottom portion of said hollow package with a residual thickness toward the inner surface.

2. The semiconductor device of claim 1, further comprising a plate-like member, having a high heat transfer rate and an area equal to or greater than an area of said island portion, joined to said island portion.

3. The semiconductor device of claim 1, wherein said vapor-impermeable moistureproof plate is formed of material selected form a group comprising aluminum, copper, iron, oxides thereof or alloys, whose heat transfer rate is 0.01 cal/cm.sec.

4. The semiconductor device of claim 3, wherein a lead member is provided between said bonding surface and said vapor-impermeable moistureproof plate and connects said vapor-impermeable moistureproof plate to said bonding surface of said hollow package.

5. A solid image pickup device comprising said semiconductor device claimed in any of claims 2-4 or 1.

* * * * *